(12) United States Patent
Aksyuk et al.

(10) Patent No.: US 6,392,221 B1
(45) Date of Patent: May 21, 2002

(54) MICRO-ELECTRO-MECHANICAL OPTICAL DEVICE

(75) Inventors: Vladimir Anatolyevich Aksyuk, Piscataway; David John Bishop, Summit, both of NJ (US)

(73) Assignees: Agere Systems Guardian Corp., Orlando, FL (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/390,158

(22) Filed: Sep. 3, 1999

Related U.S. Application Data

(63) Continuation-in-part of application No. 08/997,175, filed on Dec. 22, 1997, now Pat. No. 5,994,159.

(51) Int. Cl.[7] .............................................. G02B 26/00
(52) U.S. Cl. ..................................... 250/216; 250/234
(58) Field of Search ............................... 250/216, 234, 250/235, 236, 214 R; 33/568, 569, 570; 362/285, 286, 287, 288; 359/290, 291, 292; 428/88; 385/140; 438/50, 52

(56) References Cited

U.S. PATENT DOCUMENTS

| | | | |
|---|---|---|---|
| 5,658,636 A | * 8/1997 | Reed et al. | ............... 428/88 |
| 5,903,380 A |   5/1999 | Motamedi et al. | ......... 359/224 |
| 5,994,159 A | * 11/1999 | Aksyuk et al. | ........... 438/52 |
| 6,116,756 A | * 9/2000 | Peeters et al. | ............ 362/285 |
| 6,137,623 A | * 10/2000 | Roberson et al. | ......... 359/291 |
| 6,137,941 A | * 10/2000 | Robinson | .................... 385/140 |

OTHER PUBLICATIONS

Chen et al., *IEEE*, "A Low Voltage Micromachined Optical Switch By Stress–Induced Bending", pp. 424–428, 1999.
Cowan et al., *SPIE*, "Vertical Thermal Actuators for Micro–Opto–Electro–Mechanical Systems", vol. 3226, pp. 137–146, 1997.
T. Akiyama et al., "A Quantitative Analysis of Scratch Drive Actuator Using Buckling Motion," *Proc. 8th IEEE International MEMS Workshop*, pp. 310–315 (1995).
K.S.J. Pister, "Microfabricated hinges," *Sensors and Actuators—A Physical*, vol. A33, No. 3, pp. 249–256 (Jun. 1, 1992).
L. Y. Lin et al., "Free–Space Micromachined Optical Switches with Submillisecond Switching Time for Large–Scale Optical Crossconnects," *IEEE Photonics Technology Letters*, vol. 10, No. 4, pp. 525–527 (Apr. 1, 1998).

* cited by examiner

*Primary Examiner*—John R. Lee
(74) *Attorney, Agent, or Firm*—Richard J. Botos

(57) ABSTRACT

A micro-electro-mechanical optical device is disclosed. The micro-electro-mechanical optical device includes a micro-electro-mechanical structure coupled with an optical device. Both the micro-electro-mechanical structure and the optical device are disposed on a substrate surface. The micro-electro-mechanical structure lifts the optical device a predetermined distance above the plane of the substrate surface. Thereafter, the lifted optical device is moveable relative to the plane of the substrate surface in response to an electrostatic field generated between the optical device and the substrate.

20 Claims, 3 Drawing Sheets

MICRO-ELECTRO-MECHANICAL OPTICAL DEVICE

RELATED APPLICATIONS

This application is a continuation-in-part of application Ser. No. 08/997,175 filed on Dec. 22, 1997 now U.S. Pat. No. 5,994,159.

FIELD OF THE INVENTION

The present invention relates generally to optical communication systems and more particularly, to micro-electro-mechanical optical devices.

DESCRIPTION OF THE RELATED ART

Optical communication systems typically include a variety of optical devices (e.g., light sources, photodetectors, switches, attenuators, mirrors, amplifiers, and filters). The optical devices transmit, modify, or detect optical signals in the optical communications systems. Some optical devices are coupled to micro-electro-mechanical structures (e.g., thermal actuators) forming a micro-electro-mechanical optical device. The term micro-electro-mechanical structure as used in this disclosure refers to a microscopic structure that moves mechanically under the control of an electrical signal.

Cowan, William D., et al., "Vertical Thermal Actuators for Micro-Opto-Electro-Mechanical Systems", SPIE, Vol. 3226, pp. 137–146 (1997), describes a micro-electro-mechanical structure useful for moving optical devices. In Cowan et al., the micro-electro-mechanical structure is a thermal actuator. The thermal actuator is coupled to an optical mirror. Both the thermal actuator and the optical mirror are disposed on a surface of a substrate. The thermal actuator has multiple beams. A first end of each beam is coupled to the optical mirror. A second end of each beam is attached to the substrate surface.

Each beam of the thermal actuator has two material layers stacked one upon the other. The stacked material layers each have a different coefficient of thermal expansion.

The thermal actuator mechanically moves the optical mirror in response to a current being applied to the beams. Applying the current to the beams heats the stacked material layers. As the beams are heated, at least a portion of each beam is heated above the brittle to ductile transition of the material layers, causing a permanent mechanical deformation thereto which remains upon cooling. When the beams deform a first end of each beam as well as the optical mirror coupled thereto lift a predetermined height above the plane of the substrate surface. Such micro-electro-mechanical structures provide a limited range of motion for optical devices coupled thereto which makes them undesirable.

Therefore, micro-electro-mechanical optical devices capable of controlling the movement of the optical devices coupled thereto continue to be sought.

SUMMARY OF THE INVENTION

The present invention is directed to a micro-electro-mechanical optical device. The micro-electro-mechanical optical device includes a micro-electro-mechanical structure coupled with an optical device. Both the micro-electro-mechanical structure and the optical device are disposed on a substrate surface. The micro-electro-mechanical structure lifts the optical device a predetermined distance above the plane of the substrate surface. Thereafter, the lifted optical device is moveable relative to the plane of the substrate surface in response to an electrostatic field generated between the optical device and the substrate.

The micro-electro-mechanical structure includes a plurality of first and second beams. A first end of the plurality of first beams is coupled to a plate in hinged attachment with the substrate surface. The hinged plate includes a v-shaped notch. The hinged plate is coupled to an engagement plate. A first end of the plurality of second beams is coupled with the engagement plate. The engagement plate is also coupled with the optical device. When unassembled the beams, the hinged plate, and the engagement plate lie flat on the substrate surface.

The engagement plate has a pair of v-shaped notches located at opposite ends thereof. Each pair of v-shaped notches on the engagement plate is located within the region of the v-shaped notch on the hinged plate.

First ends of the plurality of first beams lift in an upward direction, substantially in an arc, above the plane of the substrate surface in response to the application of an activation force. As the first ends of the plurality of first beams are lifted above the plane of the substrate surface, they rotate the hinged plates out of the plane of the substrate surface. When the hinged plates are rotated out of the plane of the substrate surface, the plurality of second beams lift the engagement plate as well as the optical device above the plane of the substrate. As the engagement plate is lifted, it completes the rotation of the hinged plate started by the first beams so that the hinged plates are about ninety degrees out of the plane of the substrate.

A variety of activation forces can be applied to the beams to lift the optical device. Suitable examples include thermal contraction of the beam layers, beam contraction due to intrinsic stress, and electromagnetic forces.

After the optical device is lifted above the plane of the substrate surface, an electrostatic field is generated between the lifted optical device and the substrate surface. The electrostatic field is generated by applying a bias voltage between the optical device and a portion of the substrate. The electrostatic field moves the optical device by deflecting (or rotating) the optical device toward the substrate surface. The deflection distance of the optical device depends on the amount of the applied bias voltage.

Both the substrate and the optical device are preferably conductive so that the bias voltage may be applied thereto. When either of the substrate or the optical device are insufficiently conductive to deflect such optical device toward the substrate surface, conductive layers (e.g., electrodes) are optionally formed on regions thereof.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

Figure 1:
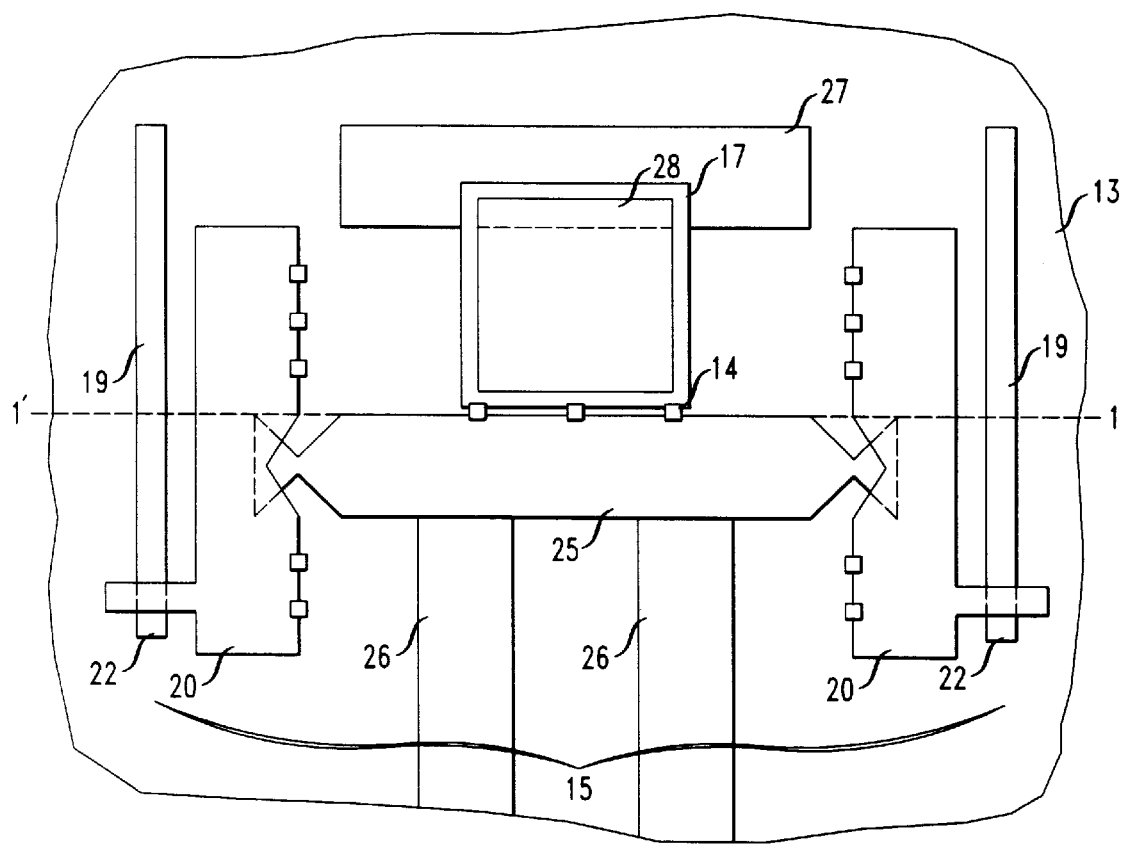
FIG. 1 depicts a top view of a substrate having a micro-electro-mechanical optical device of the present invention disposed on a surface thereof including an optical device coupled to a micro-electro-mechanical structure.

The present invention is directed to a micro-electro-mechanical optical device suitable for use in optical communication systems. Referring to FIG. 1, the micro-electro-mechanical optical device includes a micro-electro-mechanical structure 15 and an optical device 17 disposed on a surface of a substrate 13. The micro-electro-mechanical structure 15 is coupled to the optical device 17. For example, micro-electro-mechanical structure 15 is coupled to the optical device 17 with springs 14.

The electro-mechanical structure 15 includes a plurality of beams 19, 26. A first end 22 of beams 19 is coupled to a plate 20 in hinged attachment with the substrate surface 13. The hinged plate includes a v-shaped notch. The hinged plate 20 is coupled to an engagement plate 25. The engagement plate 25 is also coupled with the optical device 17. A first end of beams 26 is coupled to the engagement plate 25. A second end of beams 26 is coupled to the substrate surface 13. When unassembled the beams 19, 26, the hinged plate 20, and the engagement plate 25 lie flat on the substrate surface 13.

The engagement plate 25 has a pair of v-shaped notches located at opposite ends thereof. Each pair of v-shaped notches on the engagement plate 25 is located within the region of the v-shaped notch on the hinged plate 20.

Figure 2:
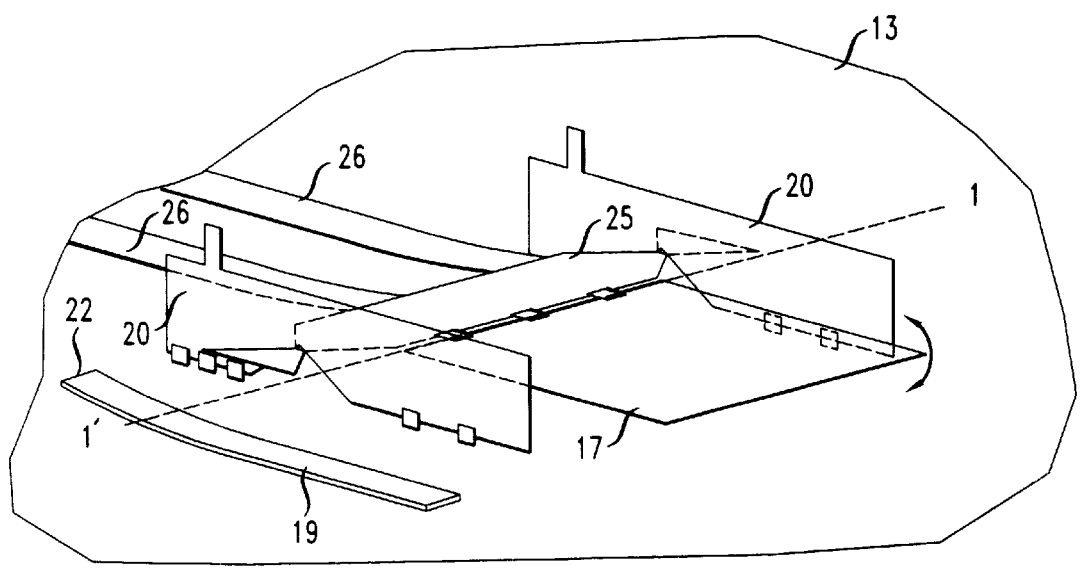
FIG. 2 is a side view of the micro-electro-mechanical optical device of FIG. 1 after the optical device lifted above the plane of the substrate surface by the micro-electro-mechanical structure.

Referring to FIG. 2, the first ends 22 of the beams 19 lift in an upward direction, substantially in an arc, above the plane of the substrate surface in response to the application of an activation force. As the first ends 22 of the beams 19 are lifted above the plane of the substrate surface, they rotate the hinged plates 20 out of the plane of the substrate.

When the hinged plates 20 are rotated out of the plane of the substrate, the beams 26 lift the engagement plate 25 as well as the optical device above the plane of the substrate. As the engagement plate is lifted above the plane of the substrate, the pair of v-shaped notches on the engagement plate 25 slide into the v-shaped notch on the hinged plate 20. When the engagement plate 25 is lifted, it completes the rotation of the hinged plate 20 started by the beams 19 so that the hinged plates are about ninety degrees out of the plane of the substrate. The height of the v-shaped notch on the hinged plate 20 limits the height to which the optical device is lifted and holds it in a fixed, well-defined position.

Figure 3:
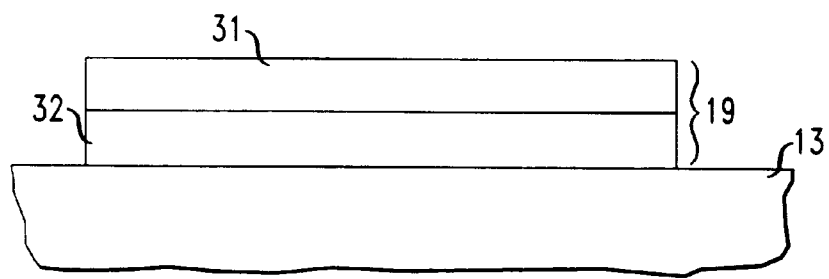
FIG. 3 is a cross-sectional view of one configuration for a beam before an activation force is applied thereto.

A variety of activation forces can be applied to the electro-mechanical structure to lift the first ends 22 of the beams. Referring to FIG. 3, when the activation force applied to the electro-mechanical structure is based on thermal contraction of the beams, each beam 19, 26 includes two or more material layers 31, 32 stacked one upon the other. The stacked material layers 31, 32 each have a different coefficient of thermal expansion.

In one embodiment, the topmost material layer 31 of each beam 19, 26 has a coefficient of thermal expansion larger than that of the other material layer 32.

Figure 4:
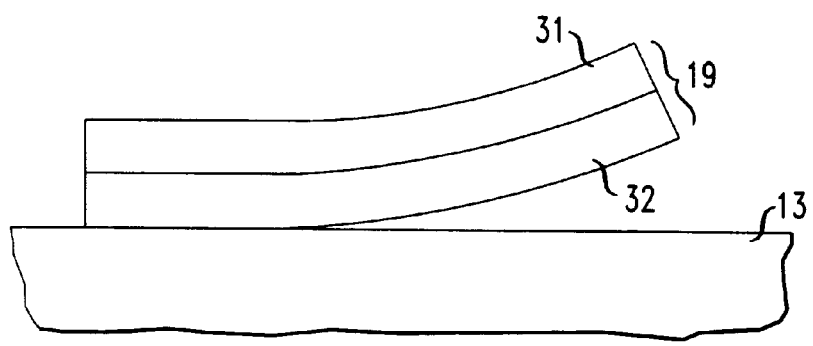
FIG. 4 is a cross-sectional view of the beam of FIG. 5 after the activation force has been applied thereto.

Applying a current to the beams 19, 26 heats the stacked material layers 31, 32. The current is applied to the beams 19, 26 from a current source (not shown). Referring to FIG. 4, when the stacked material layers 31, 32 are heated they curl up, lifting the first end of each beam 19, 26 as well as the optical mirror (not shown) coupled thereto out of the plane of the substrate surface 13. The height that the end of each beam lifts out of the plane of the substrate surface depends on the length of the beams as well as the composition of the material layers used to form the beams. However, the height that the end of each beam 26 lifts out of the plane of the substrate surface is preferably sufficient to lift the engagement plate 25 and rotate the hinged plate about 90 degrees relative to the substrate surface.

Figure 5:
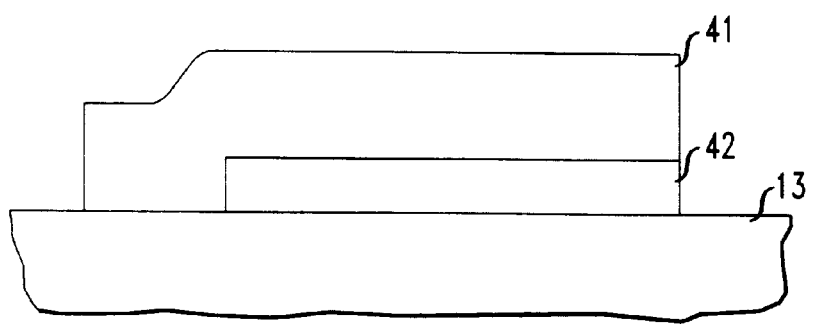
FIG. 5 is a cross-sectional view of an alternate configuration for the beams before an activation force is applied thereto.
Figure 6:
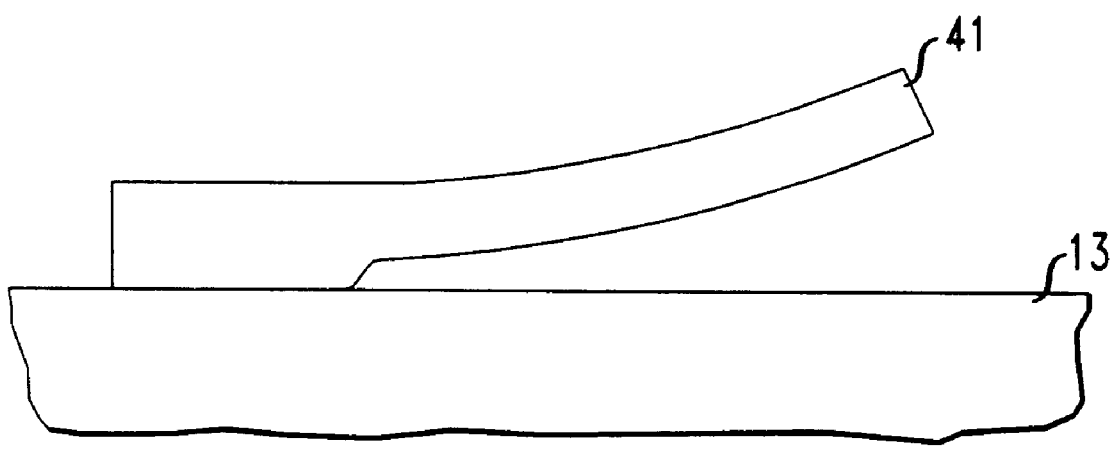
FIG. 6 is a cross-sectional view of the beam of FIG. 7 after the activation force is applied thereto.

Alternatively, when the activation force applied to the electro-mechanical structure is based on beam contraction due to intrinsic stress, each beam 19, 26 includes two or more material layers 41, 42 stacked one upon the other on the substrate surface 13, as shown in FIG. 5. The topmost material layer 41 has an intrinsic stress. The topmost material layer optionally has a stress gradient therein. The bottom material layer 42 is a sacrificial layer.

When the sacrificial material layer 42 is removed (e.g., by etching), the two or more topmost layers 41 lift the first end of each beam 19,26 as well as the hinged plate (not shown) coupled thereto above the plane of the substrate surface 13. The height that the end of each beam lifts out of the plane of the substrate surface depends on the length of the beams as well as the composition of the material layers used to form the beams. However, the height that each beam 26 lifts out of the plane of the substrate surface is preferably sufficient to lift the engagement plate 25 and rotate the hinged plate about 90 degrees relative to the substrate surface.

Other suitable activation forces include scratch drives, and electromagnetic forces. Illustrative electro-mechanical structures based on scratch drives are discussed in Akiyam, T. et al., "A Quantitative Analysis of Scratch Drive Actuator Using Buckling Motion", Proc. $8_{th}$ IEEE International MEMS Workshop, pp. 310–315 (1995) and electro-mechanical structures based on electromagnetic forces are discussed in Busch-Vishniac, I. J., "The Case for Magnetically Driven Microactuators", Sensors and Actuators A, A33, pp. 207–220, (1992).

After the electro-mechanical structure 15 lifts the optical device 17 above the plane of the substrate, the lifted optical device 17 is moveable in response to an electrostatic field generated between such optical device 17 and the substrate surface 13. The electrostatic field is generated by applying a bias voltage between the optical device 17 and the substrate surface 13.

Referring to FIGS. 1 and 2, when the electrostatic field is generated between the optical device 17 and the substrate 13 (or electrode 27) such electrostatic field can rotate such optical device 17 around an axis 1-1'. The angle that the optical device 17 is rotated around axis 1-1' depends on the magnitude of the electrostatic field generated between the optical device 17 and the substrate 13 (or electrode 27). The magnitude of the electrostatic field depends on the amount of the applied bias voltage.

Alternatively, the optical device can be made to deflect substantially towards the substrate or move using both rotation and deflection. Such motion depends on the electrode 27 geometry as well as the coupling between the optical device and the engagement plate.

Both the optical device and the substrate are preferably conductive so that the bias voltage may be applied across them to generate the electrostatic field. When either of the optical device or the substrate are insufficiently conductive to generate the electrostatic field, conductive layers (electrodes) 27, 28 are optionally formed on regions thereof as shown in FIG. 1.

The micro-electro-opto-mechanical device of the present invention is fabricated by providing a substrate that is suitably prepared (i.e., doped, as appropriate) and cleaned. Suitable substrate materials include silicon, gallium arsenide, indium phosphide, germanium or indium tin oxide (ITO) coated glass.

A plurality of material layers are formed in a planar arrangement on a surface of the substrate. Examples of suitable material layers include polysilicon, silicon nitride, and silicon dioxide.

After each layer of the plurality of material layers are formed on the substrate, each layer is patterned to form a micro-electro-mechanical structure as well as an optical device. For example, the electro-opto-mechanical device shown in FIG. 1, including a mirror 17 as well as beams 19, 26 is fabricated using a Multi-User MEMS Process (MUMPS) provided by the MCNC MEMS Technology Applications Center, MCNC, Research Triangle Park, N.C. (see SmartMUMPs Design Handbook at mems.mcnc.org).

In the MUMPS process the micro-electro-mechanical structure and the optical mirror are formed in polysilicon layers, oxide layers (e.g., phosphosilicon glass) provides sacrificial layers, and silicon nitride electrically isolates the micro-electro-mechanical structure and optical mirror from the substrate. The micro-electro-mechanical structure and optical mirror are formed in the polysilicon layers with multiple photolithography steps.

Photolithography is a process which includes the coating of one or more of the polysilicon layers and phosphosilicon glass layers with a photoresist (i.e., an energy sensitive material), exposure of the photoresist with an appropriate mask, and developing the exposed photoresist to create the desired etch mask for subsequent pattern transfer into the one or more underlying polysilicon layers and phosphosilicon glass layers. The pattern defined in the photoresist is transferred into the one or more underlying polysilicon layers and phosphosilicon glass layers by etching for example in a reactive ion etch (RIE) system.

The following example is provided to illustrate a specific embodiment of the present invention.

EXAMPLE 1

A micro-electro-mechanical optical device having the structure depicted in FIG. 1 was obtained from the MEMS Technology Application Center, MCNC, Research Triangle Park, N.C. The micro-electro-mechanical optical device was disposed on a surface of a silicon substrate. The silicon substrate had a resistivity of about 1–2 ohm-cm. A multi-layered planar arrangement of alternating polysilicon layers (POLY0, POLY1 and POLY2) and phosphosilicon glass layers (OX1 and OX2), formed over a 600 nm (nanometer) thick silicon nitride layer was formed on the silicon substrate.

The polysilicon layers POLY0, POLY1 and POLY2 had thicknesses of about 0.5 $\mu$m (micrometers), 2.0 $\mu$m, and 1.5 $\mu$m, respectively. The phosphosilicon glass layers OX1 and OX2 had thicknesses of about 2 $\mu$m and 0.75 $\mu$m, respectively. A 0.5 $\mu$m layer of Cr/Au was formed on the POLY2 layer.

The silicon nitride layer, the polysilicon layers (POLY0, POLY1 and POLY2), the phosphosilicon glass layers (OX1 and OX2), and the Cr/Au layer were formed on the silicon substrate using low pressure evaporation techniques.

Referring to FIG. 1, the electro-mechanical structure 15 and the optical device 17 were defined in the multi-layered planar arrangement using photolithographic techniques. The electro-mechanical structure included two beams 19, 26 each coupled at one edge to a plate 20 in hinged attachment with the substrate. The beams 19 each had a width of about 50 $\mu$m and a length of about 300 $\mu$m. The beams 26 had a width of about 100 $\mu$m and a length of about 500 $\mu$m. The beams were defined in the POLY1 and POLY2 layers. Beams 19, 26 also had Cr/Au layer deposited thereon to create intrinsic stresses, making them curl and assemble the structure.

The hinged plates 20 had a width of about 300 $\mu$m and a height of about 70 $\mu$m.

The v-shaped notch had a notch height of about 50 $\mu$m. The hinged plates 20 were defined in the POLY2 and POLY1 layers.

The engagement plate 25 had a length of about 400 $\mu$m and a width of about 150 $\mu$m. Each v-shape notch had a notch height of about 70 $\mu$m. The engagement plate 25 was defined in the POLY1 and POLY2 layers.

The optical device was a mirror having dimensions of about 300 $\mu$m×300 $\mu$m. The optical device was defined in the POLY1, POLY2, and Cr/Au layers.

An edge of the optical device was coupled to the engagement plate with a spring 14. The spring is defined only in the POLY1 layer.

The Electrodes 27 were about 300 $\mu$m long and about 200 $\mu$m wide and were formed using POLY0.

Each fabrication step mentioned above was performed at the MEMS Technology Application Center, MCNC, Research Triangle Park, N.C.

After the electro-mechanical structure and the optical device were defined in the POLY0, POLY1, POLY2, OX1, OX2, and Cr/Au layers, the electro-mechanical structure and the optical device were release from the surface of the silicon substrate by etching the phosphosilicon glass layers in a bath of 49% HF at room temperature for about 1–2 minutes.

After the phosphosilicon glass layers were removed, the beams rotated the hinged plate and lifted the engagement plate as well as the optical device off of the substrate surface. The optical device was lifted to a height of about 50 $\mu$m above the substrate surface.

A voltage of about 100 V was applied between the optical device and pad 27 on the substrate surface. After the voltage was applied between the optical device and pad 27, the optical device pivoted about axis 1-1' (FIG. 1), so that the optical device was at an angle of about 5° with respect to the substrate surface.

The invention claimed is:

1. A micro-electro-mechanical optical device, comprising:
   a substrate having an optical device and a micro-electro-mechanical structure disposed on a surface thereof wherein the micro-electro-mechanical structure includes a plurality of beams, a plurality of plates in hinged attachment with the substrate and an engagement plate, wherein each hinged plate includes a v-shaped notch, wherein the engagement plate has a pair of v-shaped notches, wherein the v-shaped notches on the engagement plate are configured to slide into a corresponding v-shaped notch on the hinged plate; and
   wherein the micro-electro-mechanical structure is coupled to the optical device, and wherein the beams lift both the hinged plate and the engagement plate above the plane of the substrate surface in response to the activation force thereby lifting the optical device above the plane of the substrate surface in response to an activation force, and wherein the lifted optical device is movable relative to the plane of the substrate surface in response to the generation of an electric field between the optical device and the substrate.

2. The micro-electro-mechanical optical device of claim 1 wherein each beam comprises one or more material layers.

3. The micro-electro-mechanical optical device of claim 2 wherein a first material layer is characterized by a first coefficient of thermal expansion and a second material layer is characterized by a second coefficient of thermal expansion different from the first coefficient of thermal expansion.

4. The micro-electro-mechanical optical device of claim 2 wherein at least one of the one or more material layers has an intrinsic stress.

5. The micro-electro-mechanical optical device of claim 2 wherein the first and second material layers are selected from the group consisting of silicon nitride, polysilicon, silicon dioxide, and metal.

6. The micro-electro-mechanical optical device of claim 2 wherein at least one of the one or more material layers has a stress gradient.

7. The micro-electro-mechanical optical device of claim 1 wherein the electric field is generated by applying a bias voltage between the optical device and the surface of the substrate.

8. The micro-electro-mechanical optical device of claim 1 wherein the electric field is generated by applying a bias voltage between the optical device and an electrode on the surface of the substrate.

9. The micro-electro-mechanical optical device of claim 7 or 8 wherein the bias voltage applied between the optical device and the substrate is less than about 1000 V.

10. The micro-electro-mechanical optical device of claim 1 wherein the optical device is an optical mirror.

11. A method for moving an optical device, comprising the steps of:

providing a substrate having an optical device and a micro-electro-mechanical structure disposed on a surface thereof, wherein the micro-electro-mechanical structure is coupled to the optical device and wherein the micro-electro-mechanical structure includes a plurality of beams, a plurality of plates in hinged attachment with the substrate and an engagement plate, wherein each hinged plate includes a v-shaped notch, wherein the engagement plate has a pair of v-shaped notches;

lifting the optical device above the plane of the substrate surface by applying an activation force to the micro-electro-mechanical structure wherein the v-shaped notches on the engagement plate are configured to slide into a corresponding notch on the hinged plate when the beams lift both the hinged plate and the engagement plate above the plane of the substrate surface in response to the activation force; and moving the lifted optical device relative to the plane of the substrate surface by generating an electric field between the optical device and the substrate.

12. The method of claim 11 wherein each beam comprises one or more material layers.

13. The method of claim 12 wherein the first material layer is characterized by a first coefficient of thermal expansion and the second material layer is characterized by a second coefficient of thermal expansion different from the first coefficient of thermal expansion.

14. The method of claim 12 wherein at least one of the one or more material layers has an intrinsic stress.

15. The method of claim 12 wherein the first and second material layers are selected from the group consisting of silicon nitride, polysilicon, silicon dioxide, and metal.

16. The method of claim 12 wherein at least one of the one or more material layers has a stress gradient.

17. The method of claim 11 wherein the electric field is generated by applying a bias voltage between the optical device and the surface of the substrate.

18. The method of claim 11 wherein the electric field is generated by applying a bias voltage between the optical device and an electrode on the surface of the substrate.

19. The method of claim 17 or 18 wherein the bias voltage applied between the optical device and the substrate is less than about 1000 V.

20. The method of claim 11 wherein the optical device is an optical mirror.

* * * * *